(12) United States Patent
Kang

(10) Patent No.: US 7,402,486 B2
(45) Date of Patent: Jul. 22, 2008

(54) CYLINDER-TYPE CAPACITOR AND STORAGE DEVICE, AND METHOD(S) FOR FABRICATING THE SAME

(75) Inventor: Jae Hyun Kang, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 208 days.

(21) Appl. No.: 11/322,882

(22) Filed: Dec. 29, 2005

(65) Prior Publication Data

US 2006/0145229 A1    Jul. 6, 2006

(30) Foreign Application Priority Data

Dec. 30, 2004   (KR) .................... 10-2004-0117124

(51) Int. Cl.
*H01L 21/8234* (2006.01)
*H01L 21/8244* (2006.01)
*H01L 21/8242* (2006.01)

(52) U.S. Cl. ............... 438/238; 438/239; 438/253; 438/254; 438/244; 257/E21.647; 257/E21.648; 257/E21.089

(58) Field of Classification Search ............ 438/238, 438/239, 253, 254, 244; 257/E21.647, E21.648, 257/E21.089
See application file for complete search history.

(56) References Cited

U.S. PATENT DOCUMENTS

| | | | | |
|---|---|---|---|---|
| 5,399,518 | A | * | 3/1995 | Sim et al. ............... 438/396 |
| 5,468,578 | A | * | 11/1995 | Rolfson ..................... 430/5 |
| 5,576,126 | A | * | 11/1996 | Rolfson ..................... 430/5 |
| 5,930,621 | A | * | 7/1999 | Kang et al. ............. 438/253 |
| 6,140,201 | A | | 10/2000 | Jenq et al. |
| 6,171,903 | B1 | | 1/2001 | Chiou |
| 6,228,736 | B1 | | 5/2001 | Lee et al. |
| 6,403,416 | B1 | * | 6/2002 | Huang et al. ........... 438/241 |
| 6,498,386 | B2 | | 12/2002 | Pan |
| 6,548,349 | B2 | | 4/2003 | Kim |

* cited by examiner

*Primary Examiner*—Michael S. Lebentritt
*Assistant Examiner*—Mohsen Ahmadi
(74) *Attorney, Agent, or Firm*—Andrew D. Fortney

(57) ABSTRACT

A one cylinder storage device and a method for fabricating a capacitor are disclosed, realizing simplified fabrication by overexposure with a mask having a plurality of holes, in which the method includes forming a contact hole in an insulating layer on a semiconductor substrate; forming a conductive layer on the insulating layer to fill the contact hole; forming a photoresist layer on the conductive layer; forming a photoresist layer pattern by overexposure and generating a side lobe phenomenon; forming a cylindrical lower electrode by patterning the conductive layer using the photoresist layer pattern as a mask; and forming a dielectric layer and an upper electrode covering the lower electrode.

21 Claims, 19 Drawing Sheets

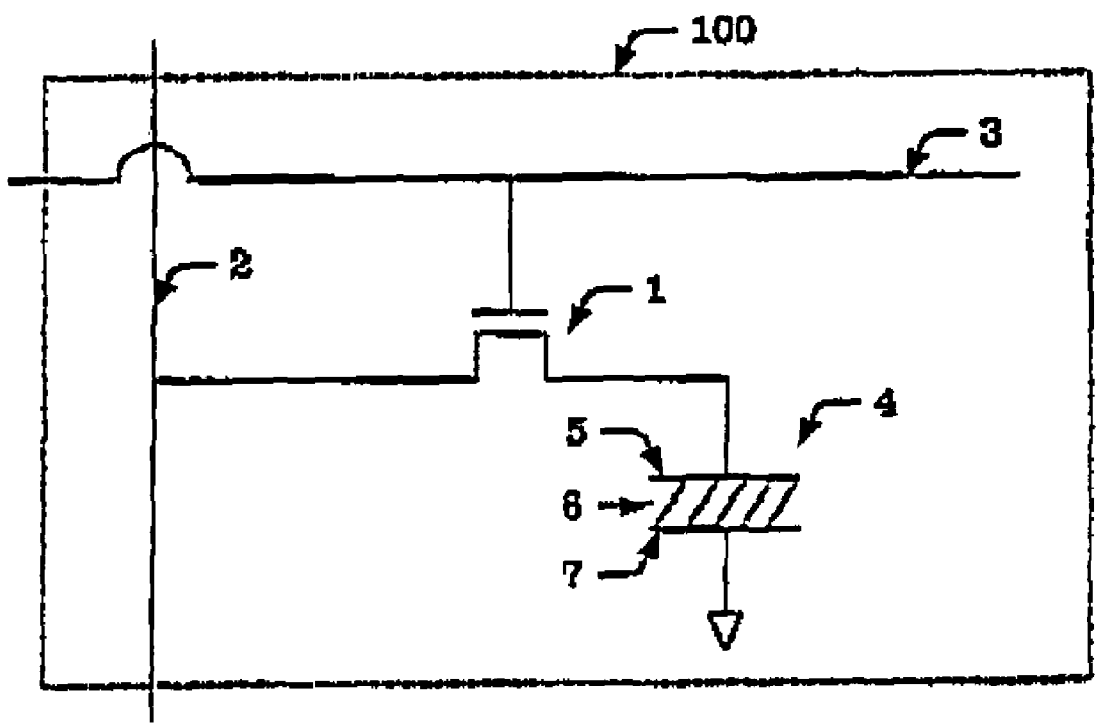

CYLINDER-TYPE CAPACITOR AND STORAGE DEVICE, AND METHOD(S) FOR FABRICATING THE SAME

CROSS-REFERENCE TO RELATED APPLICATIONS

This application claims the benefit of Korean Application No. P2004-117124, filed on Dec. 30, 2004, which is hereby incorporated by reference as if fully set forth herein.

BACKGROUND OF THE INVENTION

1. Field of the Invention

The present invention relates to memory deices and method(s) for fabricating a semiconductor (memory) device, and more particularly, to a cylindrical capacitor and/or a one cylinder storage (OCS) device and method(s) for making the same using a side lobe phenomenon.

2. Discussion of the Related Art

A dynamic random access memory (DRAM) is one of many typical memory devices. In one widely-known embodiment, the DRAM has a unit cell including one transistor and one capacitor. In comparison to the transistor, the capacitor is generally relatively large. In this respect to improve integration of the DRAM, efforts to decrease the size of the capacitor while maintaining a storage capacity of the capacitor have been made.

DRAM is typically used to obtain higher integration than is generally available with Static random access memory (SRAM). A DRAM cell generally includes a Field Effect Transistor (FET) and a capacitor for storing a bit of bin data. As shown in FIG. 1, for example, DRAM cell 100 may include transistor 1 and capacitor 4. Transistor 1 is coupled to bit line 2 at the source terminal and to word line 3 at the gate terminal of the transistor. The drain terminal of transistor 1 is coupled to storage electrode 5 (otherwise referred to as the "lower electrode") of capacitor 4. A dielectric material 6 is arranged between lower electrode 5 and plate electrode 7 (otherwise referred to as the "upper electrode") for storing a charge therein.

The performance characteristic of a DRAM cell are closely related to the capacitance of the memory cell capacitor. For example, the low voltage characteristics and soft error characteristics of the memory cell are improved as the capacitance of the memory cell capacitor increases. However, as semiconductor memory devices become more highly-integrated, the horizontal area available to the cell capacitor shrink. This tends to decrease capacitance by limiting the surface area of the capacitor electrodes. Thus, methods are needed for increasing the capacitance of the memory cell capacitor, while maintaining high cell integration and reliable operation.

A number of techniques have been suggested for increasing the capacitance of a memory cell capacitor, while maintaining high memory cell integrating. Such methods include using a thin film to form the capacitor dielectric layer, using a material with a high dielectric constant for the dielectric layer, and increasing the effective area of a capacitor electrode by making a cylinder-type capacitor and/or by growing hemispherical sizing (HSGs) on the surface of the capacitor electrode. The current discussion focuses on various methods for forming a cylinder-type capacitor, which functions to increase cell capacitance by increasing the electrode surface area in a vertical, rather than horizontal, direction.

The storage capacity of the capacitor can be calculated by '$C=\epsilon \times A/d$', wherein 'C' is a capacitor storage ability, 'A' is an area of an electrode, and 'd' is a distance between two electrodes. That is, the storage capacity is in proportion to a dielectric constant $\epsilon$ of a dielectric substance, and the area of the electrode for covering the dielectric substance. Also, the storage capacity is in inverse proportion to the distance between the two electrodes Accordingly, methods for improving the capacitor storage ability may focus on improving the dielectric properties of the dielectric substance and modifying a geometrical shape of the capacitor. In one method for modifying the geometrical shape of The capacitor, the capacitor may have a cylindrical shape. In this case, if the capacitor has a cylindrical shape, it is possible to increase the surface area of the electrode in the capacitor, thereby decreasing the effective unit area of the capacitor.

However, forming a cylindrical capacitor may result in various problems in the fabrication process. For example, in one typical fabrication process for a cylindrical capacitor, it is impossible to obtain a cylindrical shape in the capacitor with one mask during the photo process. As a result it may require several process steps for fabricating the cylindrical shape of the capacitor, thereby complicating the fabrication process. Also, the aforementioned fabrication process may include a wet etch process, which may damage the wafer. Accordingly, there is a need to develop a new fabrication process that can overcome the aforementioned problems in decreasing the size of the capacitor.

A method for fabricating a related art capacitor will be described as follows.

FIGS. 2A to 2H are cross sectional views of a process for fabricating a cylindrical capacitor according to the related art.

As shown in FIG. 2A, an insulating interlayer 20 (which may contain one or form insulator layers, such as USG, FSG, TEOS and/or silicon nitride, such as a USG/FSG/TEOS/USG stack) is formed on a semiconductor substrate 10, and a nitride layer 30 is deposited on the insulating interlayer 20. Then, the nitride layer 30 is pattered to form a bottom plate opening, then used as an etch stop or mask for the following process. That is, the nitride layer 30 remains on a portion of the substrate that dots not form the cylindrical capacitor. Then, a predetermined portion of the insulating interlayer 20 is removed by photolithography, thereby forming a contact hole 21. Then, a conductive layer, for example, a first polysilicon layer 40 is deposited on the insulating interlayer 20, to completely fill to contact hole 21.

As shown in FIG. 2B, a silicon oxide layer 50 (e.g., silicon dioxide, such as USG or TEOS) is deposited on the first polysilicon layer 40, to form an area corresponding to an inner part of a subsequently formed lower electrode having a cylindrical shape.

Referring to FIG. 2C, a photoresist layer is deposited on the silicon oxide layer 50, and then an expose and development process is performed thereon, thereby forming a photoresist pattern 60, defining a capacitor area.

As shown in FIG. 2D, portions of the silicon oxide layer 50 are selectively removed using the photoresist layer pattern 60 as a mask, thereby forming a silicon oxide pattern 55. After that, the photoresist pattern 60 is completely removed.

Referring to FIG. 2E, a layer 70 of a conductive material (e.g., a second polysilicon layer) is formed on the first polysilicon layer 40 and the silicon oxide pattern 55 (e.g., by a conformal deposition technique, such as CVD). At this time, the first and second polysilicon layers 40 and 70 are electrically connected to each other in the areas except the silicon oxide pattern 55.

As shown in FIG. 2F, the first and second polysilicon layers 40 and 70 are selectively removed by anisotropic dry etching (e.g., RIE, or Reactive Ion Etching). Accordingly, the second polysilicon layer 70 remains at a sidewall of the silicon oxide pattern 55, and the first polysilicon layer 40 remains below the silicon oxide pattern 55 and the second polysilicon layer 70, thereby forming a cylindrical lower electrode (e.g., a combination of polysilicon structures 40 and 70). At this time, the anisotropic dry etch process is performed by using the nitride layer 30 as an etch stopper.

As shown in FIG. 2G, the silicon oxide pattern 55 is completely removed, leaving the cylindrical capacitor lower electrode. The silicon oxide pattern 55 may be removed by wet etching.

As shown in FIG. 2H, a dielectric layer 80 (e.g., a silicon oxide such as a TEOS-based oxide) is (conformally) deposited on the entire surface of the substrate including the capacitor lower electrode, to form a capacitor dielectric. Then, a conductive capacitor upper electrode material 90 is formed (by blanket deposition, such as sputtering, PVD, evaporation or CVD) on the dielectric layer 80. The upper capacitor is completed by planarizing the conductive material 90 (e.g., by etchback or polishing), and a final photolithography step can be performed to remove conductive material 90 from areas outside the vertical lower capacitor structures 70.

As shown in FIG. 3, DRAM cell 200 may be formed upon a semiconductor substrate 210. In general, substrate 200 may be a silicon substrate and may include transistor diffusion regions 212 and isolation regions 214, as is known in the art. Transistor gate electrodes 220 may be formed on the substrate layer in a normal manner by forming a stack of one or more dielectric and conductive (e.g., polysilicon and optional metal silicide) layers. Next the interlevel dielectric, which nay contain USG layer 230, FSG layer 240, second USG layer 250, TEOS layer 260 and silicon nitride layer 270, may be formed on the conductive layer of gate electrodes 220. Silicon nitride layer 270 is generally patterned as described above to form a bottom plate opening, then layers 230-260 may be patterned to form a via opening, which exposes a conductive layer (generally tungsten contacts to a source/din terminal 212) of gate electrodes 220. After the openings are formed, conductive material 280 (typically, polysilicon) may be deposited on silicon nitride layer 270 and with the opening. By filing the openings with the conductive material, a bottom plate and a conductive plug may be formed, making electrical contact with the underlying conductive layer of gate electrodes 220. After portions of the polysilicon layer are removed from the top surface of silicon nitride layer 270, the upper and lower electrodes of memory cell capacitor 290 are formed in multi-step process, as described in part above. In an alterative to the s described with red to FIG. 2H, a dielectric layer 285 may be blanket deposited on the lower electrode structures 40 and 70 and on nitride layer 30, then planarized and photolithographically patterned to selectively remove the dielectric 285 from within the cylindrical lower electrode 40/70. Then a conformal capacitor dielectric (similar to dielectric 80 if FIG. 2H) and another conductive layer 295 are deposited to form pre-capacitor 290. A capacitor is subsequently formed by planarizing or removing the conductive layer 295 above the upper surface of the capacitor dielectric. (i.e., outside the lower capacitor electrode) as described herein.

However, the method for fabricating the lower electrode of the cylindrical capacitor has the following disadvantages. First, as described above, in order to form the lower electrode of the cylindrical capacitor, photolithography may be performed several times, thereby complicating fabrication process steps, and lowering yield. Also, time and cost for fabrication of the capacitor tend to increase with the number of photolithography and other processing steps. The large number of processing steps may decrease yield by increasing the probability for defects.

Also, in the exemplary related art fabrication process, the silicon oxide layer pattern may be removed by wet etching, whereby the polysilicon layer or lower electrode may be damaged. Also, a wet etchant may penetrate the edge of the wafer, thereby damaging a chip on or near the water edge. Therefore, a need exists for an improved method for forming a cylinder-type memory cell capacitor. By reducing the number of processing steps, the improved method may advantageously decrease processing time and maintaining costs, while increasing yield.

SUMMARY OF THE INVENTION

Accordingly, the present invention is directed to a method for fabricating a capacitor that substantially obviates on or more problems due to limitations and disadvantages of the related art.

An object of the present invention is to provide a method for fabricating a capacitor and a one cylinder storage (OCS) device that may be produced by such a method, to realize simplified fabrication process steps by performing an over-exposure with a mask having a plurality of holes. In one embodiment, the present invention improves upon conventional methods by at least decreasing processing time, manufacturing costs and possibly increasing yield. More specifically, the method described herein uses a unique phase shift mask (PSM) design and exposure process to form a cylindrically-shaped photoresist, which may be used during a subsequent etching process to form the cylindrically-shaped lower electrode of the storage device.

Additional advantages, objects, and feature of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described here a method for fabricating a capacitor includes for an insulating layer on a semiconductor substrate, forming a contact hole in the insulating layer; forming a conductive layer on the insulating layer to fill the contact hole; forming a photoresist layer on the conductive layer, patterning the photoresist layer by overexposure generating a side lobe phenomenon; forming a cylindrical lower electrode by patterning the conductive layer using the photoresist layer pattern as a mask; and forming a dielectric layer and an upper electrode for covering the lower electrode.

At this time, the step of forming toe (donut-shaped) photoresist layer pattern includes positioning a mask above the photoresist layer, the mask having a transmission part corresponding to the contact hole; overexposing the photoresist layer to light passed through the mask; and developing the overexposed photoresist layer. Also, the mask may include a semi-transmission part through which a percentage of light is transmitted (e.g., having a light transmittance) of 6% to 15%; and a transmission part corresponding to the portion for the contact hole, through which light is transmitted at 100% (or having a light transmittance of 100%).

Also, an energy level of the overexposure may be from about one and a half times to two and a half times as high as an energy level of an exposure for patterning the contact hole.

Further, the conductive layer comprises a conductive polysilicon layer.

Also, the patterning process of the conductive layer comprises RIE (Reactive Ion Etching).

In another embodiment, the invention provides a method for fabricating a cylinder-type storage device, comprising forming a first conductive layer above a semiconductor substrate and a photoresist layer upon the first conductive layer, overexposing the photoresist layer to radiation (or light) passed through a phase shift mask to produce a pattern in the photoresist layer having at least one substantially cylindrically-shaped structure; and etching portions of the first conductive layer not covered by the cylindrically-shaped structure to form a lower electrode of the cylinder-type storage device.

Also, the invention concerns a cylinder-type storage device, comprising a plug in a dielectric layer on a semiconductor substrate and plug comprising a conductive material; and a lower electrode on the dielectric layer and in contact with the plug, the lower electrode comprising the conductive material, and wherein sidewalls of the lower electrode are substantially cylindrical in shape and have a flat upper surface.

It is to be understood that both the foregoing general description and the following detailed description of the present invention are exemplary and planatory and are intended to provide further explanation of the invention as claimed.

BRIEF DESCRIPTION OF THE DRAWINGS

The accompanying drawings which are included to provide a further understanding of the invention and are incorporated in and constitute a part of this application, illustrate embodiments of the invention and together with the description serve to explain the principle of the invention. In the drawings:

FIG. 1 is a schematic diagram of an exemplary DRAM cell;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a capacitor according to the present invention will be described with reference to the accompanying drawings In the method for fabricating the capacitor according to the present invention, a donut-shaped or cylindrical pattern (for example, in a photoresist) may be directly formed on a wafer by photo process, thereby realizing a simplified fabrication process. Also, since wet etching is not performed, it is possible to decrease damage to the wafer. Accordingly, in order to directly form the donut-shaped or cylindrical pattern on the wafer, one may intentionally generate a side lobe phenomenon during the photo process, whereby a photoresist pattern having a cylindrical, circular or donut shape (in a plan view) may be formed.

That is, when an optimal level of overexposure is performed with an attenuated PSM (Phase Shift Mask) in the photo process for forming a contact hole, a cylindrical or donut-shaped pattern may be formed on the wafer, instead of a hole shape. Even though the cylindrical or donut-shaped pattern does not exist in the mask, it is possible to form the cylindrical or donut-shaped pattern on the wafer. In case of the cylindrical or donut-shed pattern having a thickness below 100 nm, it can be very difficult to form the pattern on the mask using recent mask fabrication technology.

In the preferred embodiment of the present invention, it is possible to form a cylindrical or donut-shaped photoresist pattern on the wafer without the side lobe phenomenon or generating the problem in the attenuated PSM.

In the attenuated PSM, instead of completely shielding surrounding portions of the desired pattern by a light-shielding chrome layer, light is passed through the surrounding portions of the mask at a transmittance of 6% to 15%. However, the transmitted light has an opposite phase to that of the light passing through the pattered portion when light having opposite phases is used in such a manner, it is possible to improve contrast in the wafer (or the photoresist deposited thereon).

Figure 4:
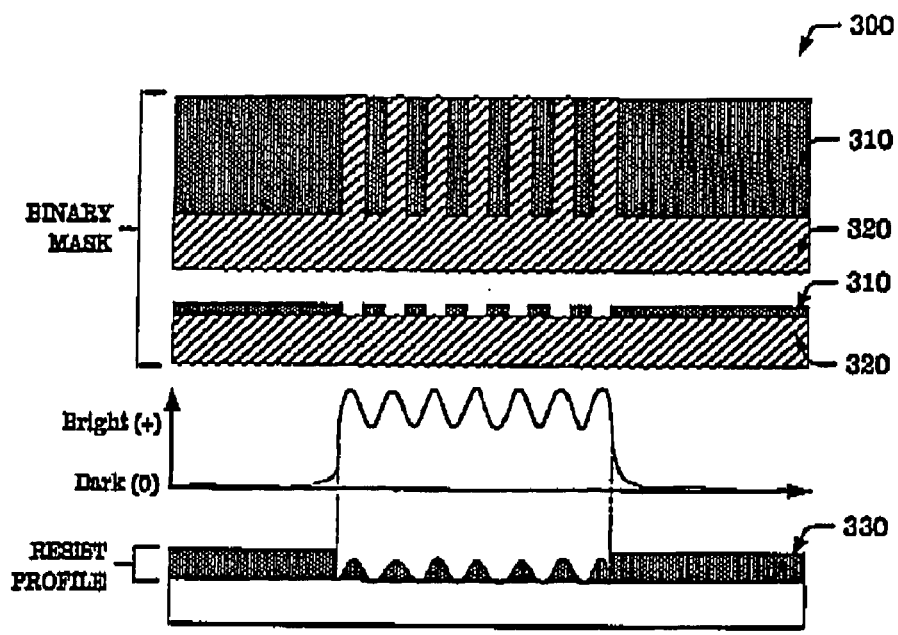
FIG. 4 illustrates an exemplary profile of a photoresist formed during a photolithography process using a binary mask.
Figure 5:
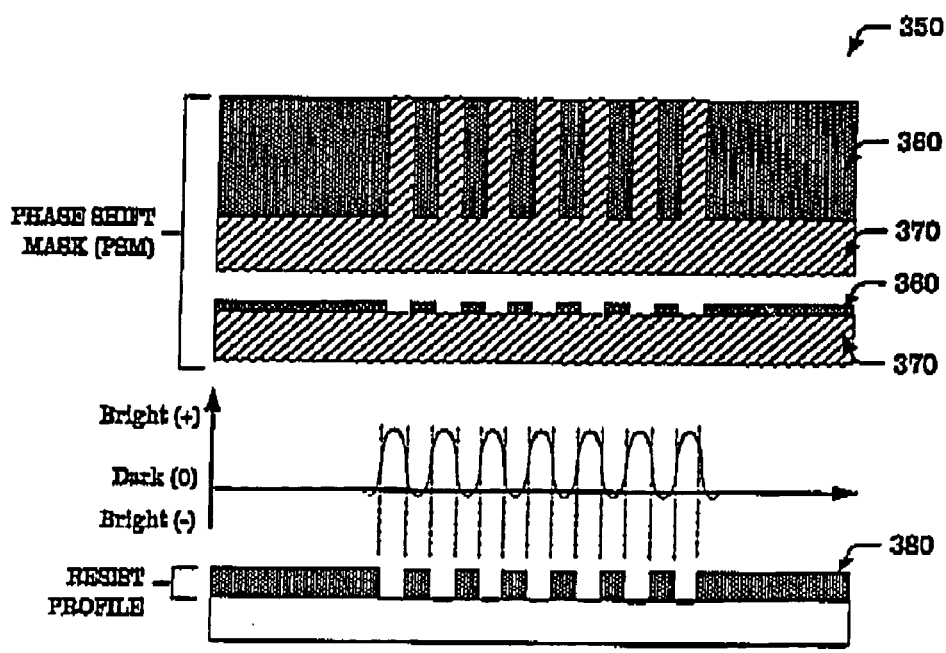
FIG. 5 illustrates an exemplary profile of a photoresist formed during a photolithography process using a phase shift mask (PSM)

FIGS. 4 and 5 illustrate exemplary photoresist process that may be formed by using a binary mask (FIG. 4) and a alternating phase shift mask (FIG. 5) during the exposure step of a photolithography process. In one example (shown in FIG. 4), binary mask 300 may include a layer of opaque material 310 (e.g., chrome) either formed upon or embedded within a layer of transparent material 320 (e.g., glass). When a layer of photoresist material is exposed to light transmitted through the transparent regions of binary mask 300, exposed portions of the photoresist are "shrunk" to produce resist profile 330.

However, the pattern within binary mask 300 may not be accurately transfer to resist 330. For example, the intensity of light transmitted onto a surface of the photoresist layer is referred to as the "aerial image". As shown in FIG. 4, the aerial image produced by binary mask 300 provides relatively low contrast between the light and dark areas. Such low contrast in the aerial or intensity image often causes non-uniform shrinkage and profile deformation in the subsequently formed resist 330.

To overcome profile deformation, an alternating phase shift mask 350 may be used to expose a layer of photoresist material 380, as shown in FIG. 5. In one example, phase shift mask 350 may be formed by replacing opaque material 301 with a layer of phase shift material 360, such as a partial transmissive or "halftone" film. In doing so, phase shift mask 350 may be used for increasing the contrast between light and dark areas of the aerial image, thereby increasing the accuracy with which the mask pattern may be transferred to the photoresist layer. In other words, phase shift mask 350 may be used to form a resist profile 380 with substantially little to no profile deformation.

Figure 6:
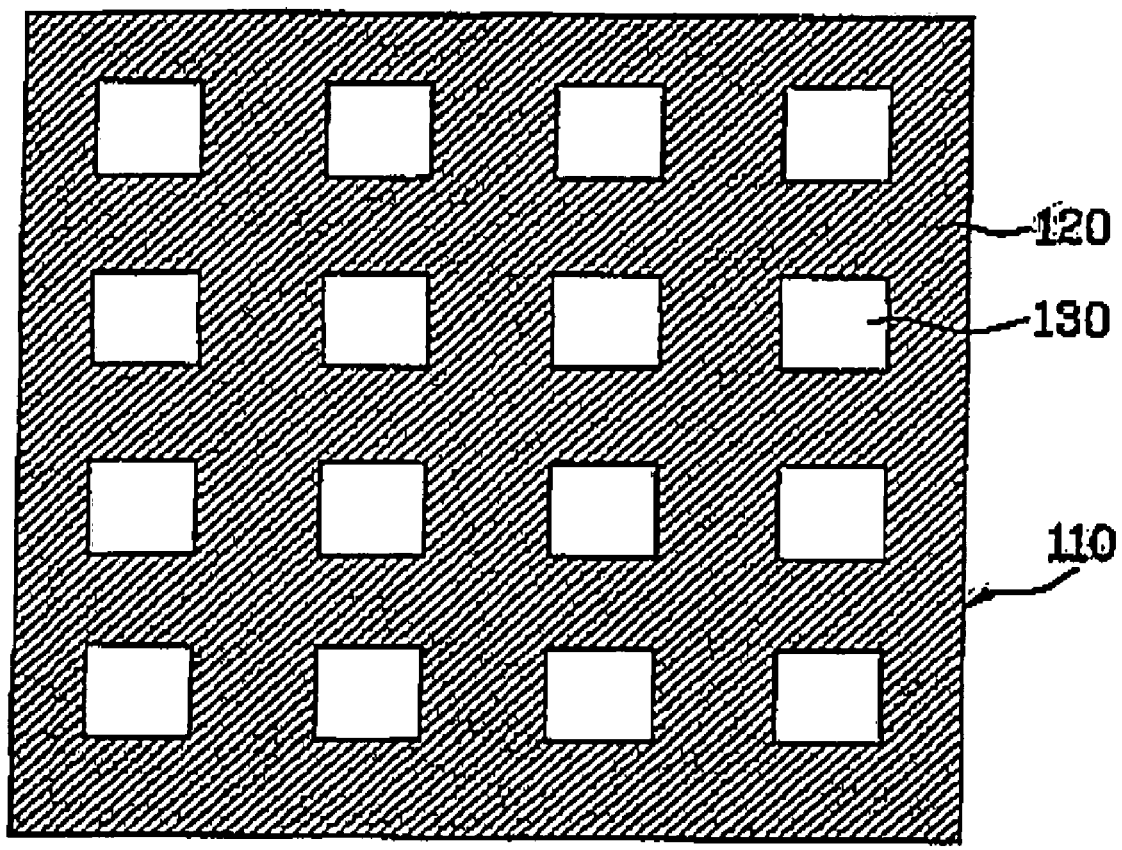
FIG. 6 is a plan view of a mask according to an embodiment of the present invention.
Figure 7:
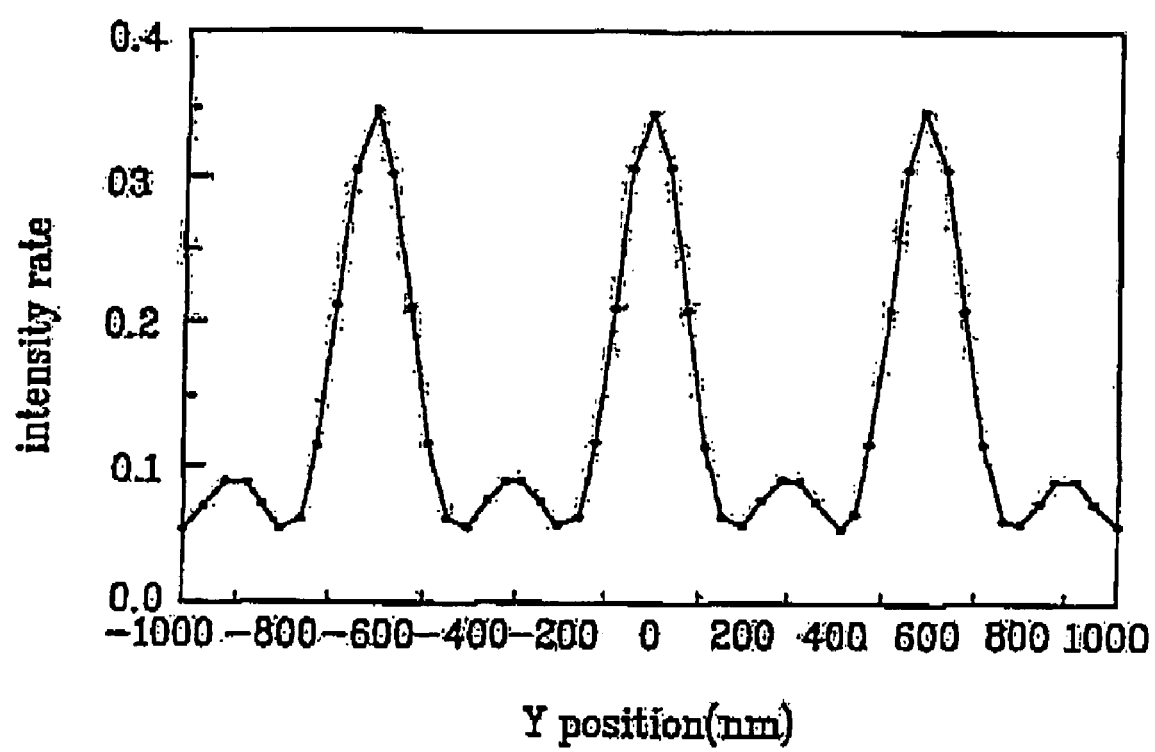
FIG. 7 is a graph of illustrating the intensity of light passing through a mask of FIG. 4.

FIG. 6 is a plan view of a mask 110 according to a first embodiment of the present invention. FIG. 7 is a graph of illustrating the intensity of light passing through a mask of FIG. 6.

First, a mask 110 of the present invention is prepared, as shown in FIG. 6. That is, the mask 110 is provided with as transmission part 120 and a transmission part 130. At this time, the light is transmission through the semi-transmission part 120 at a transmittance of 6% to 15%, and the light is transmitted at 100% through the transmission part 130. That is, the mask 110 is provided or intended to form a contact hole (e.g., for or similar to contact hole 21 in FIGS. 2A-2H, which corresponds to contact hole 201 in FIGS. A-D below). The transmission part 130 corresponds to the portion for the contact hole, and the semi-transmission part 120 corresponds to the remaining portions of the mask immediately surrounding (e.g., at least one-half of a contact hole width, but generally within 2-5 contact hole widths [preferably 2-3 contact hole widths]) the transmission part. The phase shift mask 110 may therefore include a plurality of high transmittance portions arranged within a matrix of rows and columns. Though illustrated as substantially square or rectangular in shape, the high transmittance portions and/or holes 120 may include other shapes in alterative embodiments of the invention. Phase shift (or "low transmittance") material 120 may be formed upon or embedded within a layer of transparent material (not shown), such as glass or any other material, which is at least partially optically transparent to the wavelength of light emitted from the photolithographic radiation (light) energy source.

When performing an exposure process with the mask 110, the intensity of light reaching the wafer is shown in FIG. 7. Referring to FIG. 7, on the assumption that the intensity of light passing through or corresponding to the transmission part 130 is '1', the intensity of light corresponding to the semi-transmission part 120, through which the light is transmitted at a transmittance of 6% to 15%, may be regarded as 0.1 to 0.5 according to a pitch (or center-to-center distance between adjacent transmission parts 130). In this case, a virtual image made on the water by a small peak is referred to as the side lobe, where the transmitted light overlaps (or constructively interferes) to intentionally improve to contrasts. However, in case of the manual process, since a threshold value of a photoresist PR is larger than a peak value corresponding to the semi-transmission pan 130 between the transmission parts 120, it generally has no effect on the actual PR pattern.

Figure 8:
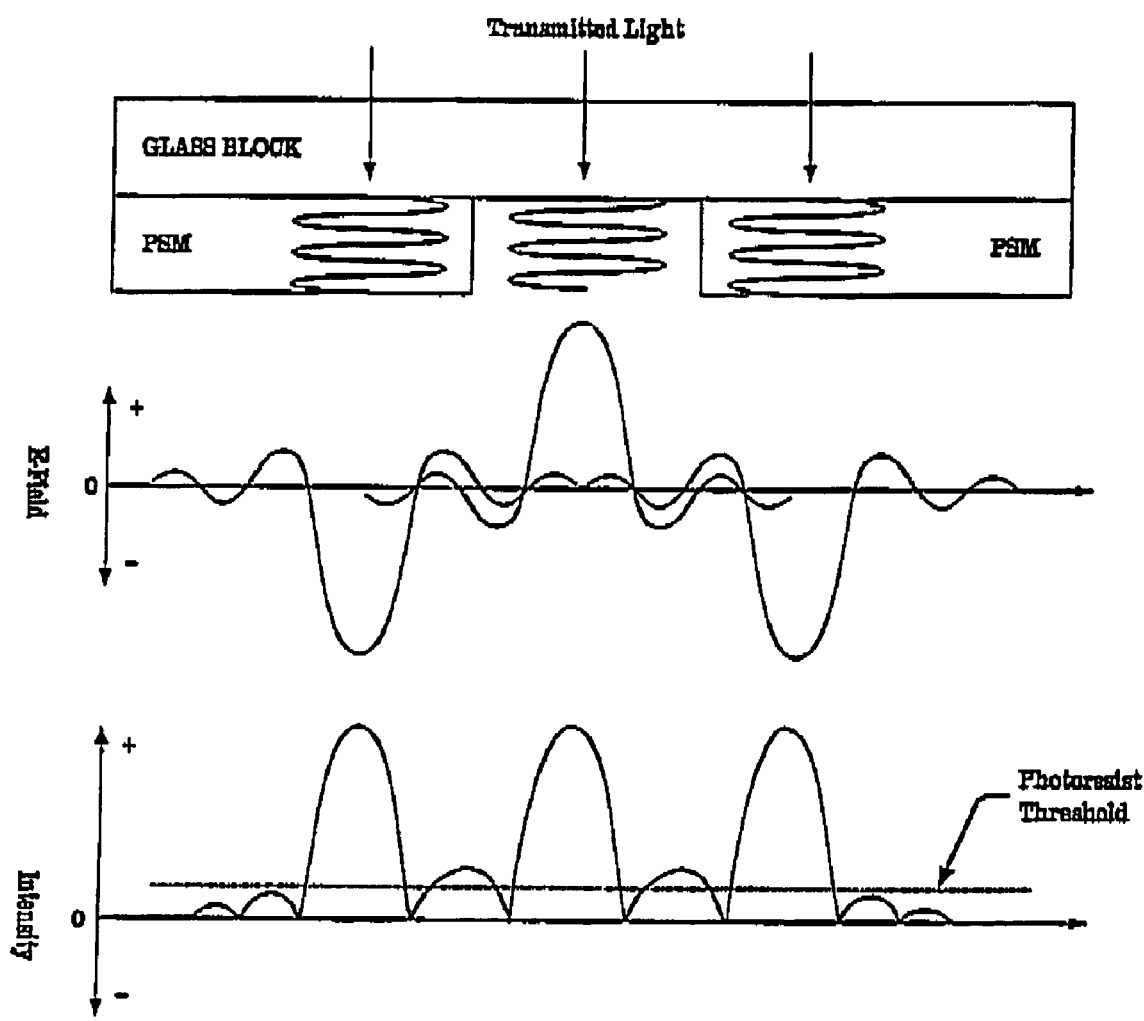
FIG. 8 illustrates exemplar phase shifting qualities of a photolithography mask comprising a phase shift material.

Generally speaking, the minor peak intensities, or "side lobes", in the graph of FIG. 7 are used in the present invention to help create the desired cylindrically-shaped structures within the photoresist material by removing select portions of the photoresist material underlying the partially transmissive portions 120 of the PSM. However, the mere presence of side lobes—a common phenomenon in conventional exposure processes—may not by themselves, necessarily provide the desired pattern. Instead, other factors including, but not limited to, the pitch between the plurality of transmission parts (or holes) 130 and the composition/thickness of the particular phase shift material used in the PSM, may play a role in providing the cylindrically-shaped pattern in the photoresist material. For example, the material composition and/or thickness of the phase shift material may be chosen, such that light transmitted through the phase shift material is shifted in phase by approximately 180 degrees. When appropriately spaced from non-shifting portions (i.e., one of the plurality of transmission parts 130), overlapping (or constructively interfering) portions of neighboring intensity images may combine to produce side lobes, which exceed the intensity threshold of the exposed photoresist material. Such a concept is illustrated in FIG. 8.

Figure 9:
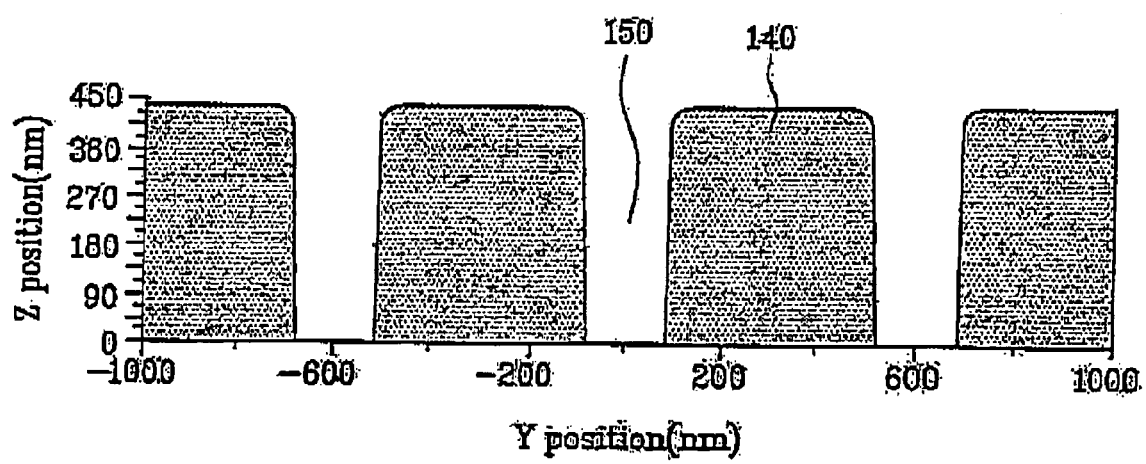
FIG. 9 is a cross sectional view of illustrating a simulated patter formed when exposing by a normal energy level with a mask of FIG. 2.
Figure 10:
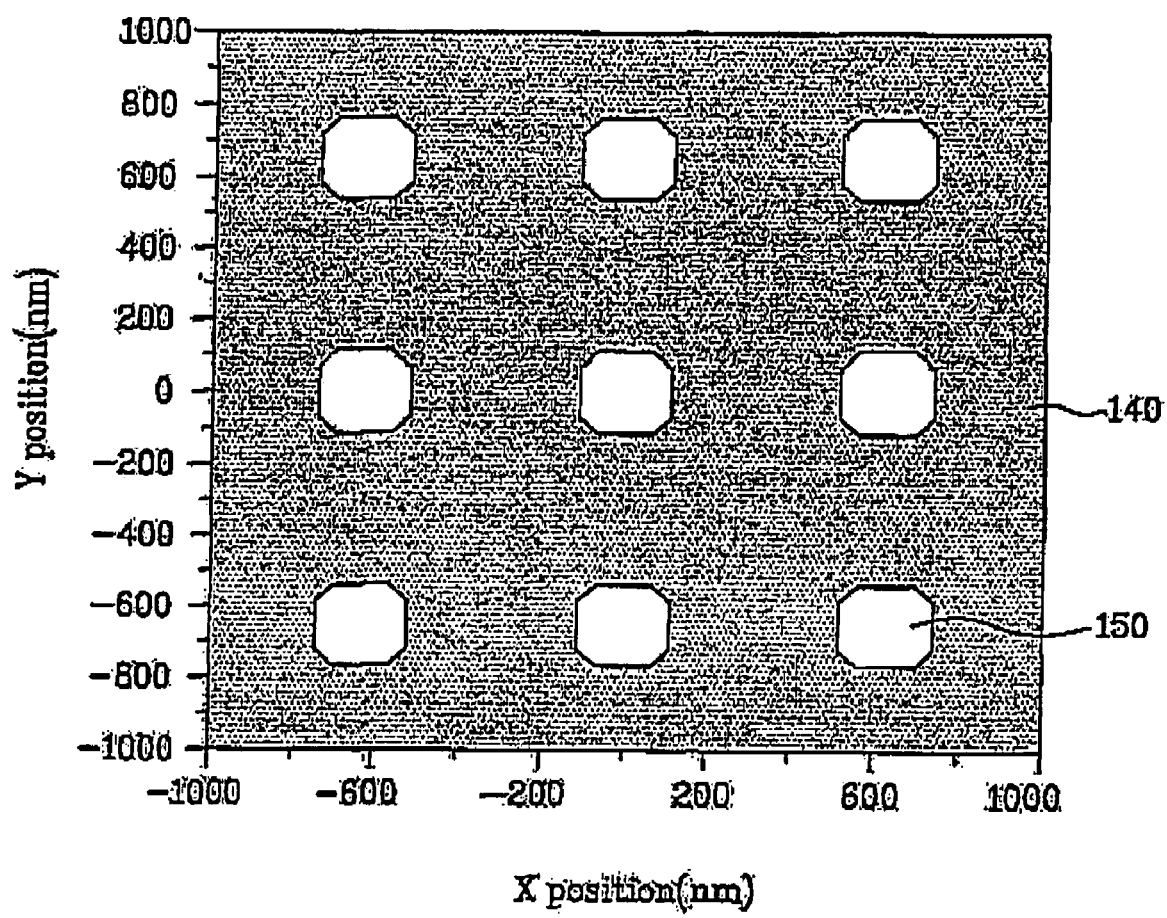
FIG. 10 is a plan view of illustrating a simulated pattern fabricated when exposing by a normal energy level with a mask of FIG. 2.

FIG. 9 is a cross sectional view of illustrating a simulated pattern formed when exposing a photoresist to a normal energy level of light passed trough a mask of FIG. 6. FIG. 10 is a plan view illustrating a simulated pattern formed when exposing a photoresist to a normal energy level of light passed through a mask of FIG. 6.

That is, a photoresist 140 is deposited on a substrate, and a normal exposure and development process is performed thereon with the mask of FIG. 6. As a result, the photoresist 140 corresponding to the transmission part 130 of the mask is selectively removed, thereby forming a contact hole pattern 150.

However, in case of the present invention, an overexposure is performed, instead of the normal exposure with the mask of FIG. 6.

If the overexposure of using the mask of FIG. 6 is performed the intensity of a peak corresponding to the semi-transmission part 130 between the transmission parts 120 increases, so that the peak value is larger the threshold value of the photoresist PR. Accordingly, overexposing forms a pattern on the portion of the photoresist corresponding to the semi-transmission part 130 between the transmission parts 120. At this time, the overexposure is from about one and a half times to about two and a half times an energy level of the normal exposure.

This pattern generally corresponds to the desired pattern shape. In FIG. 7, the intensity of light is illustrated by a one-dimensional 1D method. However, if the intensity of light is illustrated by a two-dimensional 2D method, the side lobe can be observed around the pattern at a predetermined interval. That is, if the pattern designed in the mask corresponds to a circle, the side lobe is also formed in a circle, thereby forming a donut shape or cylindrical feature in a layer of material on the semiconductor wafer. Also, the thickness of the donut (or cylinder wall) can be controlled by the intensity of the over exposure and the pitch of the pattern.

Figure 11:
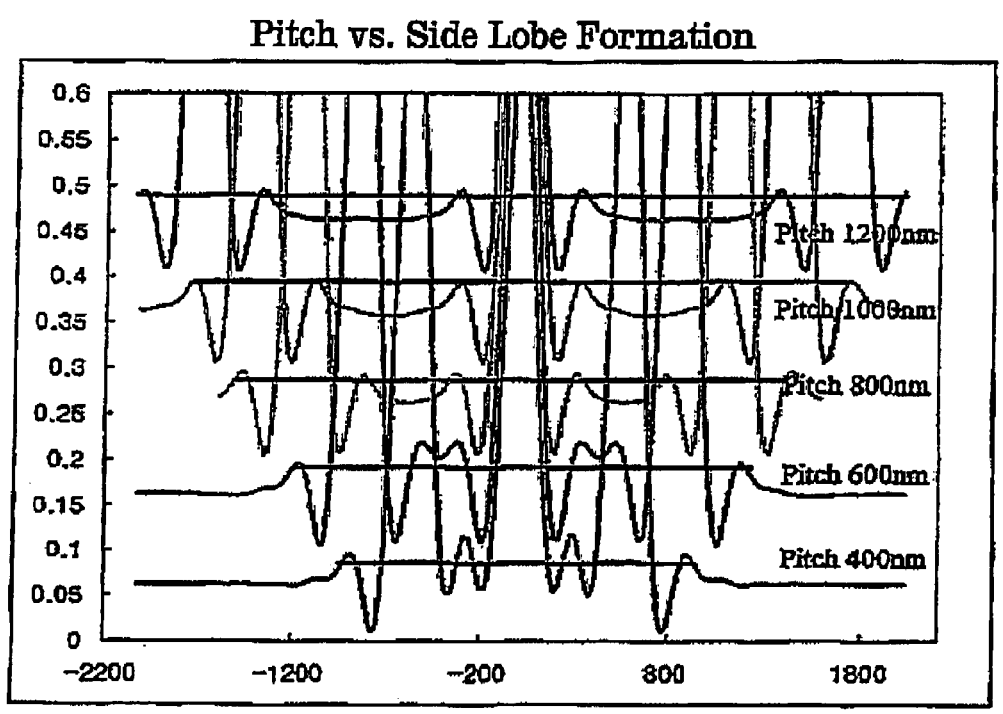
FIG. 11 is a graph illustrating pitch vs. side lobe formation.

FIG. 11 is a graph illustrating pitch versus side lobe formation. As shown in FIG. 11, a pitch of about 800 nanometers (nm) or less may provide the side lobe formation needed to obtain the desired pattern in this embodiment. However, larger or smaller center-to-center hole spacings may be sufficient in other embodiments of the invention.

Figure 12:
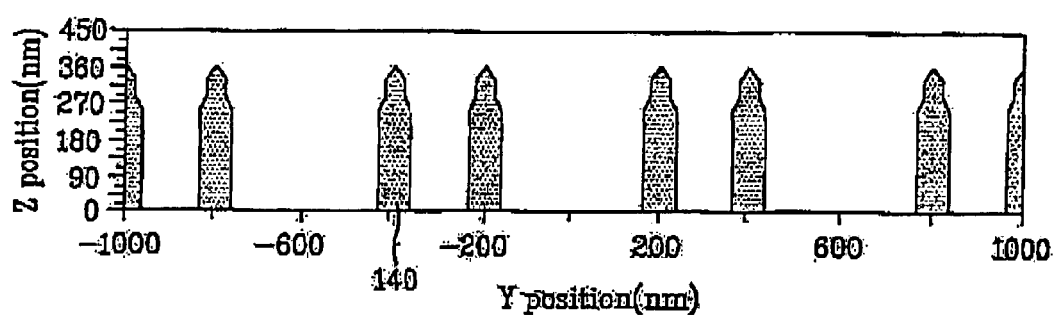
FIG. 12 is a cross sectional view of illustrating a simulated pattern formed when exposing by an over energy level with a mask of FIG. 6.
Figure 13:
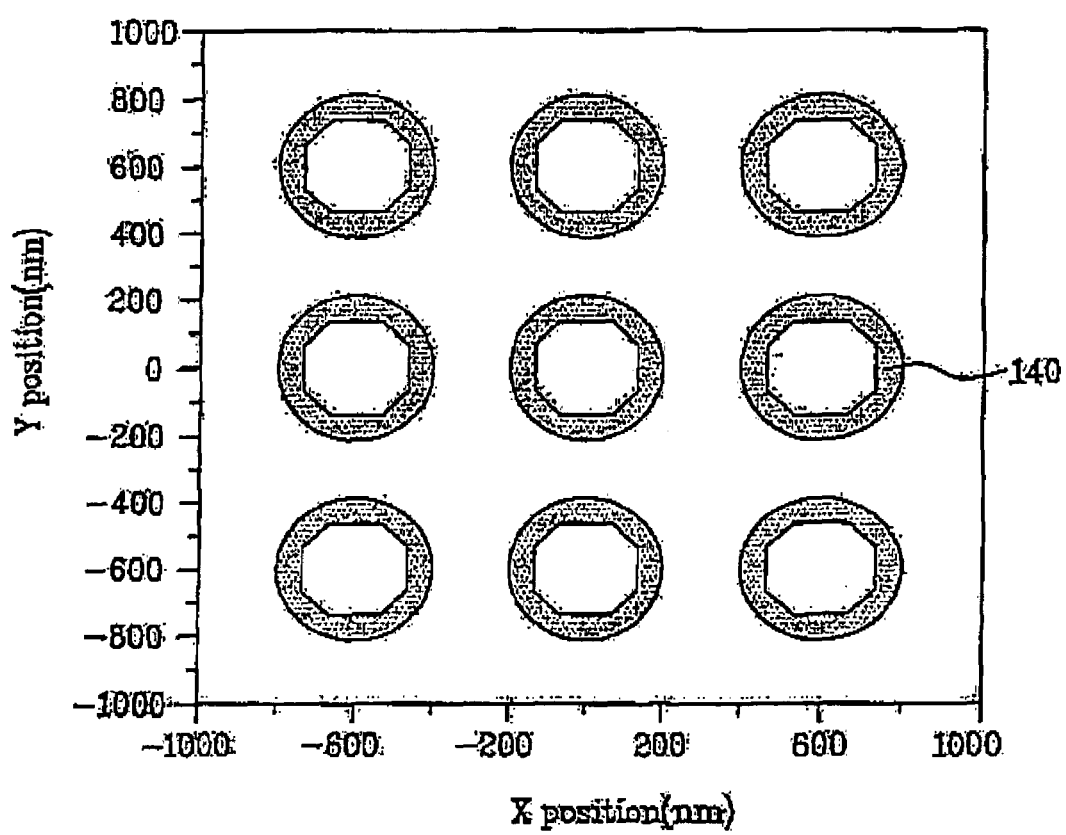
FIG. 13 is a plan view of illustrating a simulated pattern formed when exposing by an over energy level with a mask of FIG. 6.
Figure 14A:
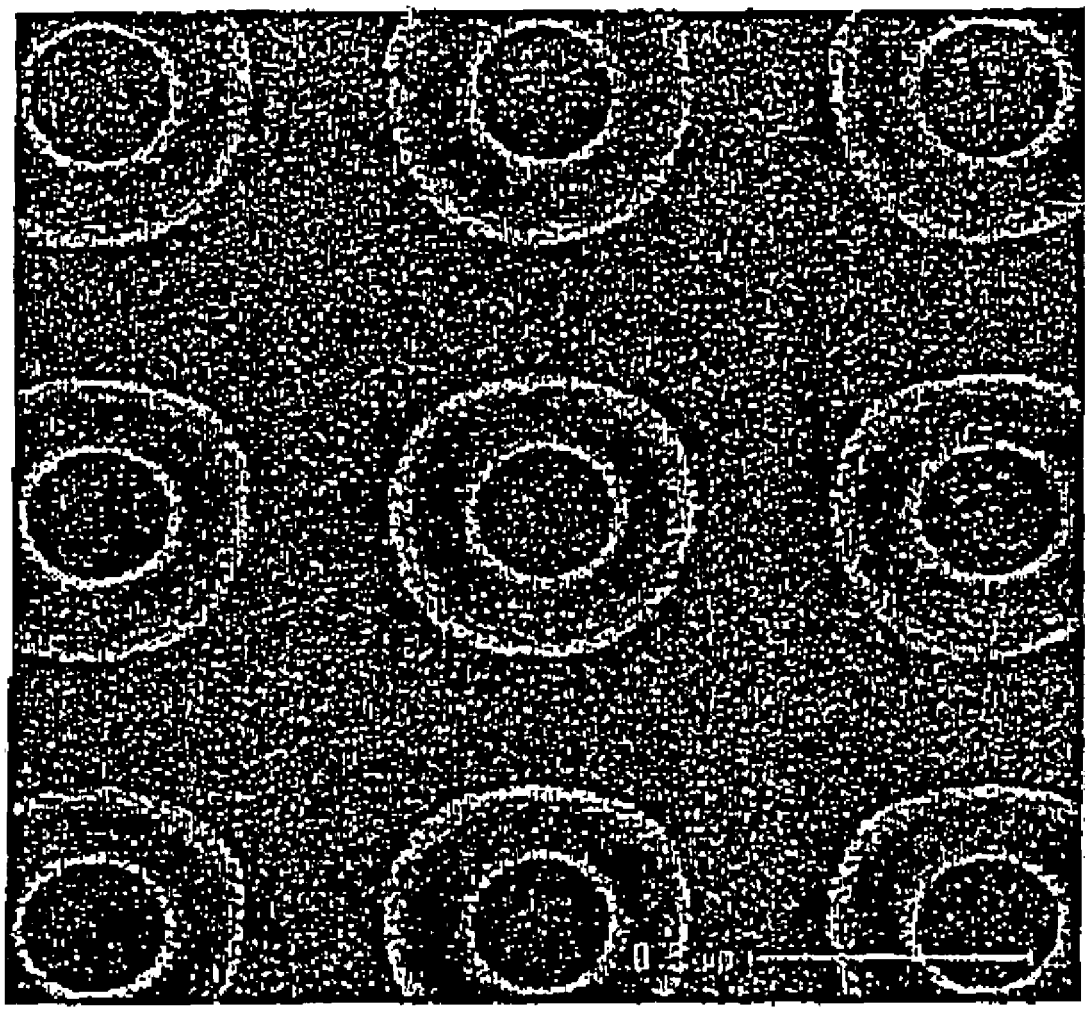
FIG. 14A a photograph of SEM for illustrating a wafer plane pattern when exposing and developing by an over energy level with a mask of FIG. 2.
Figure 14B:
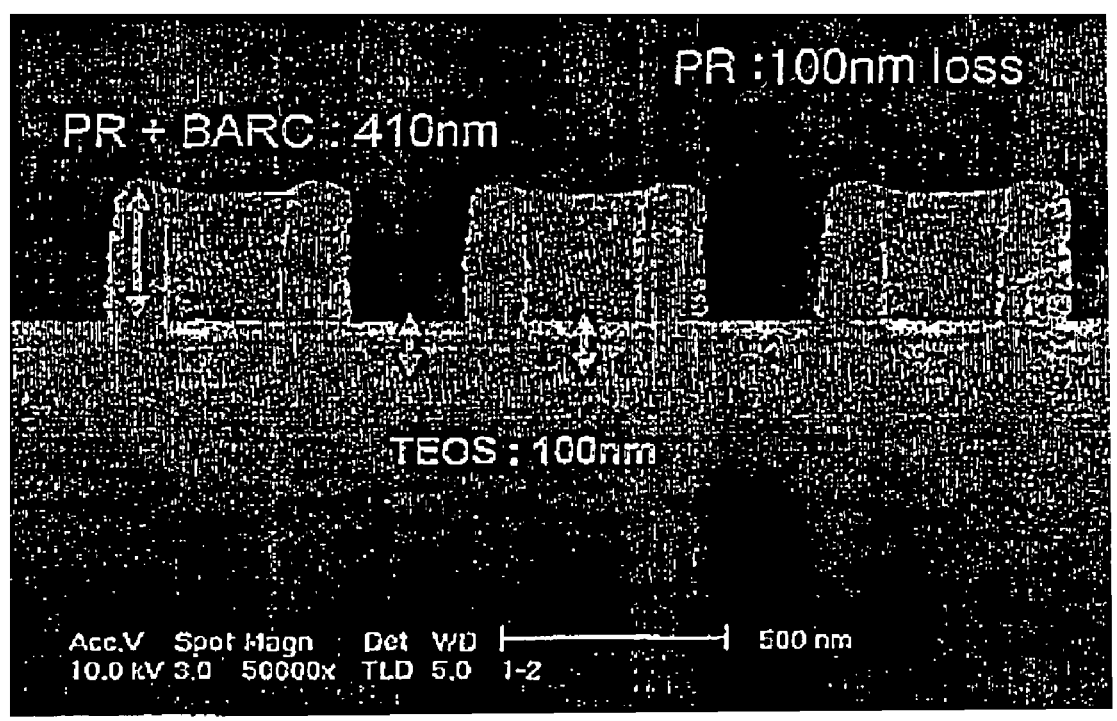
FIG. 14B is a photograph of SEM for illustrating a wafer cross sectional pattern when exposing and developing by an over energy level with a mask of FIG. 2.

FIG. 12 is a cross sectional view illustrating a simulated pattern formed when overexposing a photoresist through a mask of FIG. 6. FIG. 13 is a plan view illustrating a simulated pattern formed when overexposing a photoresist through a mask of FIG. 6. FIG. 14A is a top-down photograph of a SEM illustrating a wafer pattern when overexposing and developing a photoresist through a mask of FIG. 6. FIG. 14B is a SEM photograph illustrating a wafer cross sectional pattern when overexposing and developing a photoresist through a mask of FIG. 6.

First, a photoresist 140 is deposited on a substrate, and then an overexposure and development process is performed thereon, whereby the photoresist 140 corresponding to a boundary between the transmission part 130 and the semi-transmission part 120 remains (or forms) in a circular or cylindrical shape (i.e., "donut shape", and the remaining portions of the photoresist 140 are removed. That is, in case of overexposing with an over-energy level, the side lobe is generated by the pattern shape of the transmission part 130, whereby the photoresist pattern is formed on the wafer in a circular or donut shape.

As shown in FIGS. 14A and 14B, the photoresist pattern formed on the wafer by substantial overexposure can be checked in a SEM photograph. That is, FIGS. 14A and 14B confirm that, in actual practice, a circular or donut-shaped photoresist patter can be formed on the wafer by overexposure (using the "side lobe" phenomenon and/or a phase shift contact mask), resulting in a cylindrical pattern being formed in the material below the photoresist that is subsequently etched.

FIGS. 14A-B respectively illustrate top and cross-sectional views of experimental results obtained a forming cylindrically-shaped structures within the photoresist (PR) and bottom anti-reflective coat (BARC) layers formed upon a dielectric layer (e.g., TEOS). In particular, the scanning electron micrograph (SEM) images of FIGS. 14A-B prove that the above mentioned method may be used to form structures within (or immediately below) the photoresist layer that are substantially cylindrical in shape and substantially constant in thickness. Further experiments (i.e., partially etching portions of the dielectric layer not covered by the cylindrically-shaped photoresist and bottom anti-reflective coating structures) demonstrate that the cylindrically-shaped PR structures may be used to form a lower electrode, whose sidewalls are also substantially cylindrical in shape and substantially constant in thickness.

As explained with regard to FIG. 12, FIG. 13, FIG. 14A and FIG. 14B, an overexposure performed using a contact mask (FIG. 6, conventionally used for forming a contact hole pattern) can form a circular or donut-shaped photoresist pattern, and subsequently, a cylindrical structure in the material(s) underlying the photoresist pattern. Accordingly, in a preferred embodiment of the present invention, it is possible to omit several process steps for forming the cylindrical shape of the related art capacitor electrode. In addition, since the present cylinder structure has a planar upper surface (unlike that of the related art), the present capacitor (and OCS storage device) may have greater mechanical durability, improved electrical characteristics (due to increased uniformity of physical properties at the uppermost part of the cylindrical lower capacitor electrode), and/or other improved features and/or characteristics. Furthermore, it is possible to decrease damage to the wafer since the preferred method of the present invention does not require wet etching.

A method for fabricating the capacitor according to the present invention will be described with reference to the accompanying drawings.

FIGS. 15A to 15D are cross sectional views of an exemplary process for fabricating a cylindrical capacitor electrode according to the present invention.

Figure 15A:
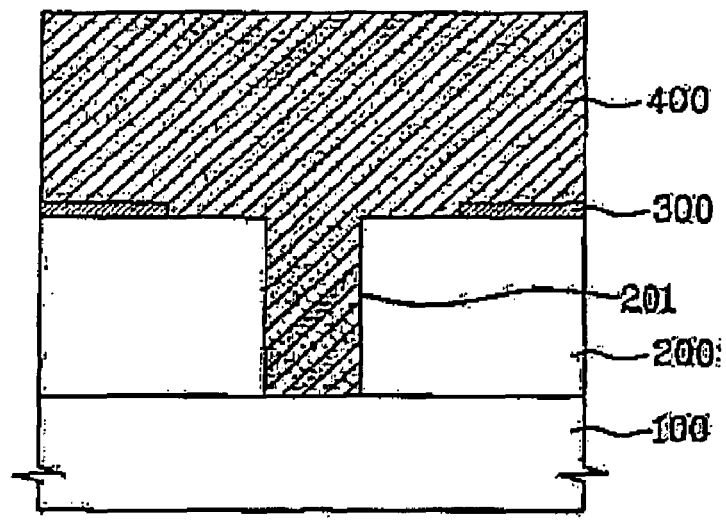
FIG. 15A to FIG. 15D are cross sectional views of the process for fabricating a cylindrical capacitor according to the present invention.

As shown in FIG. 15A, an insulating interlayer 200 (similar or identical to insulator layer 20 of the related art) is formed on a semiconductor substrate 100, and an etch stop (e.g., silicon nitride) layer 300 is deposited on the insulating interlayer 200. Then, the etch stop layer 300 is patterned and selectively removed. That is, the nitride layer 300 remains on the portions of insulating interlayer 200 that do not form the cylindrical capacitor.

Figure 2A:
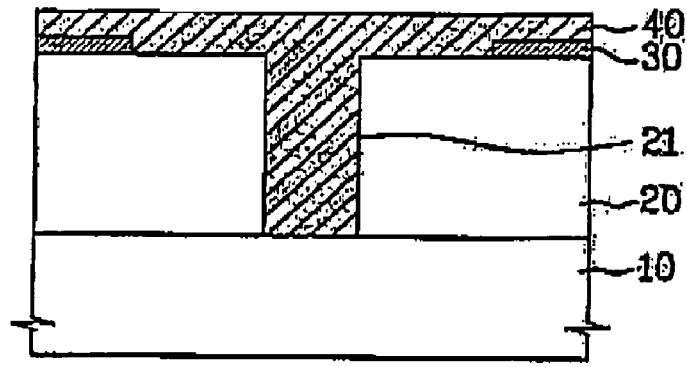
FIGS. 2A to 2H are cross sectional views of a process for fabricating a cylindrical capacitor according to the related art.
Figure 2B:
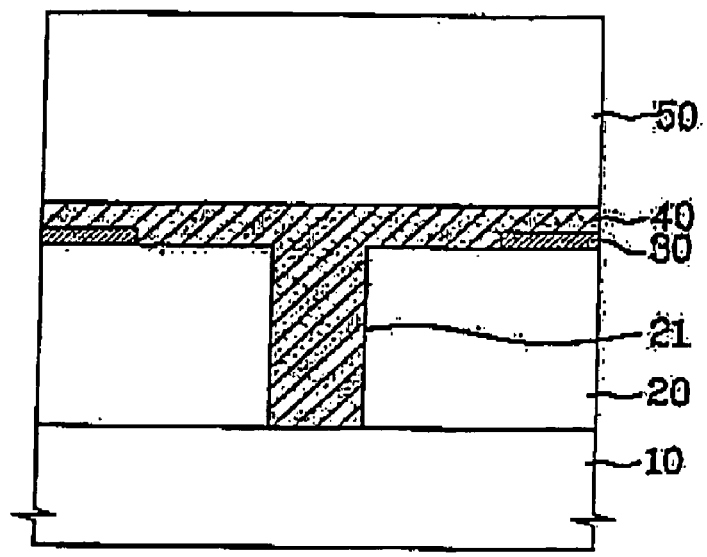
Figure 2C:
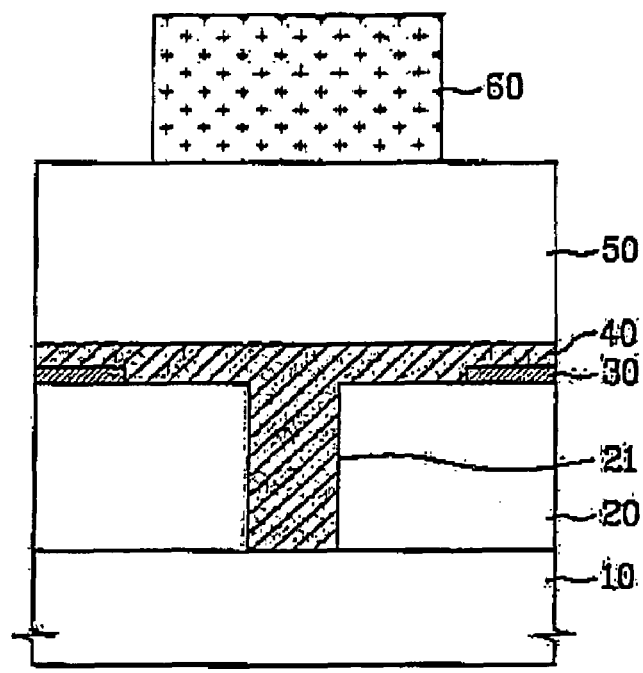
Figure 2D:
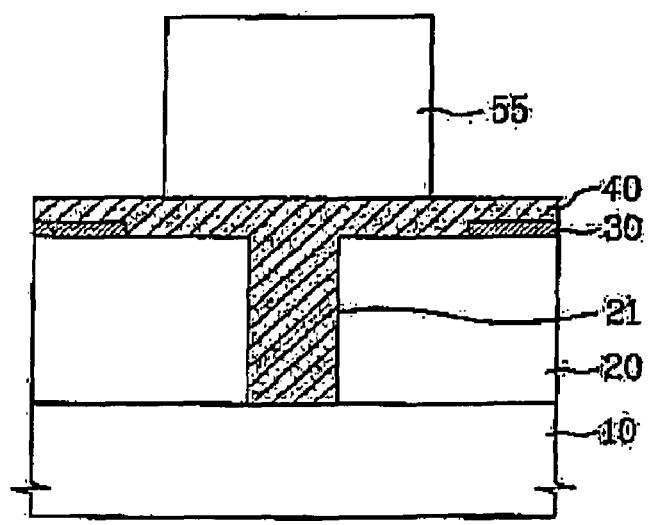
Figure 2E:
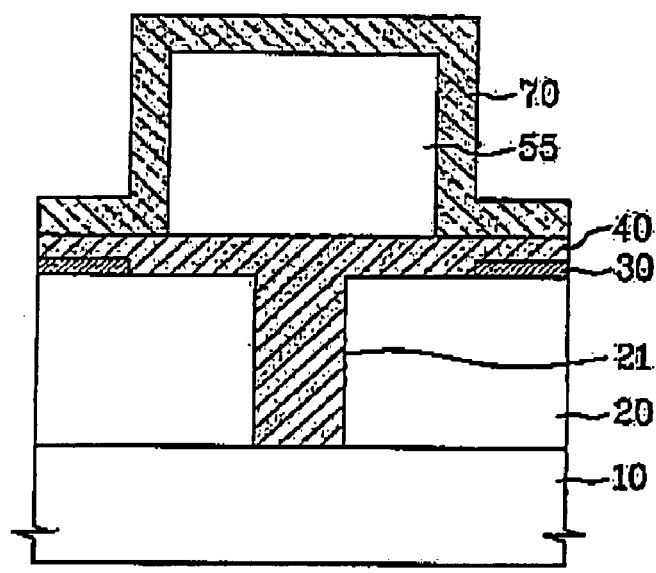
Figure 2F:
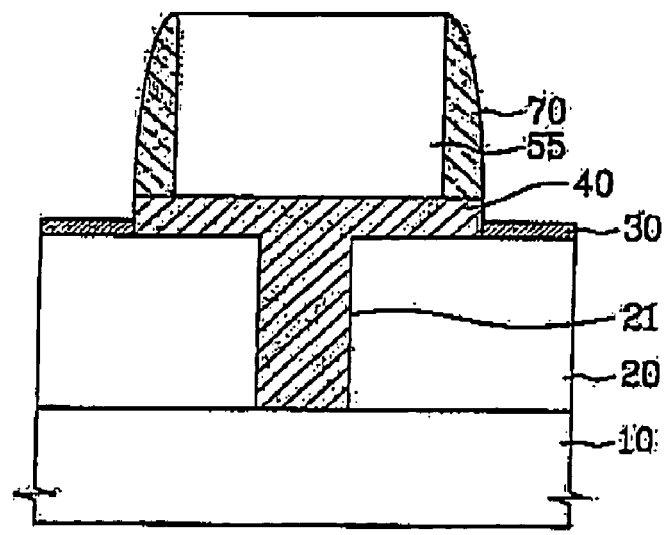
Figure 2G:
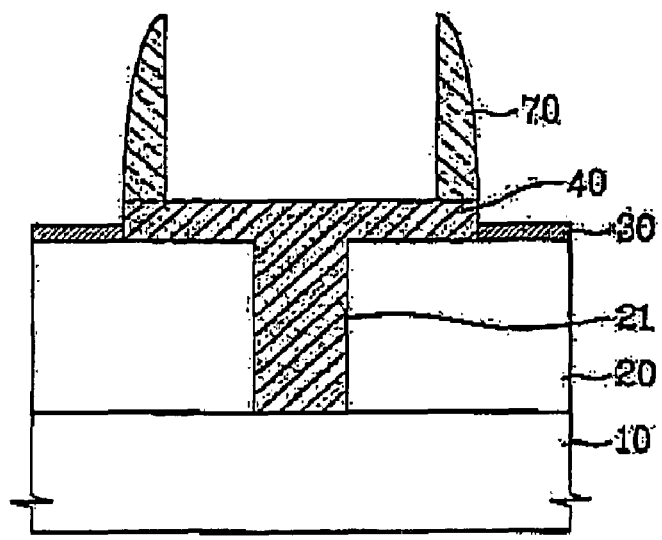
Figure 2H:
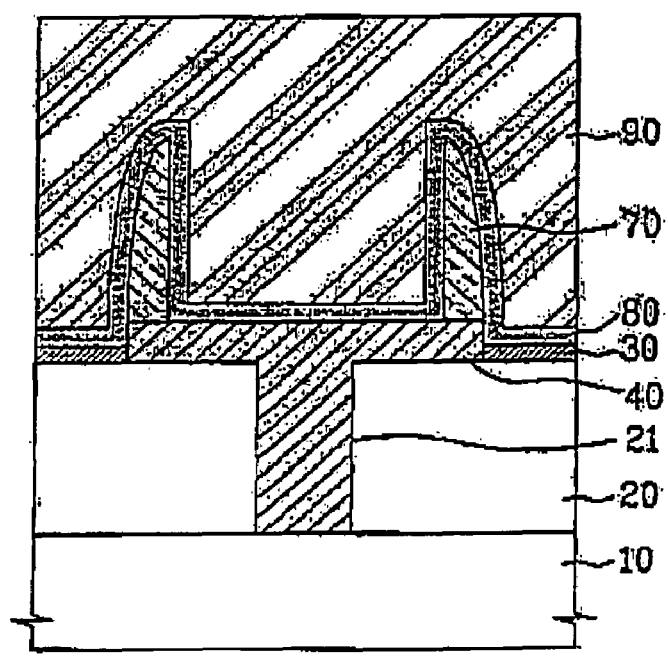
Figure 3:
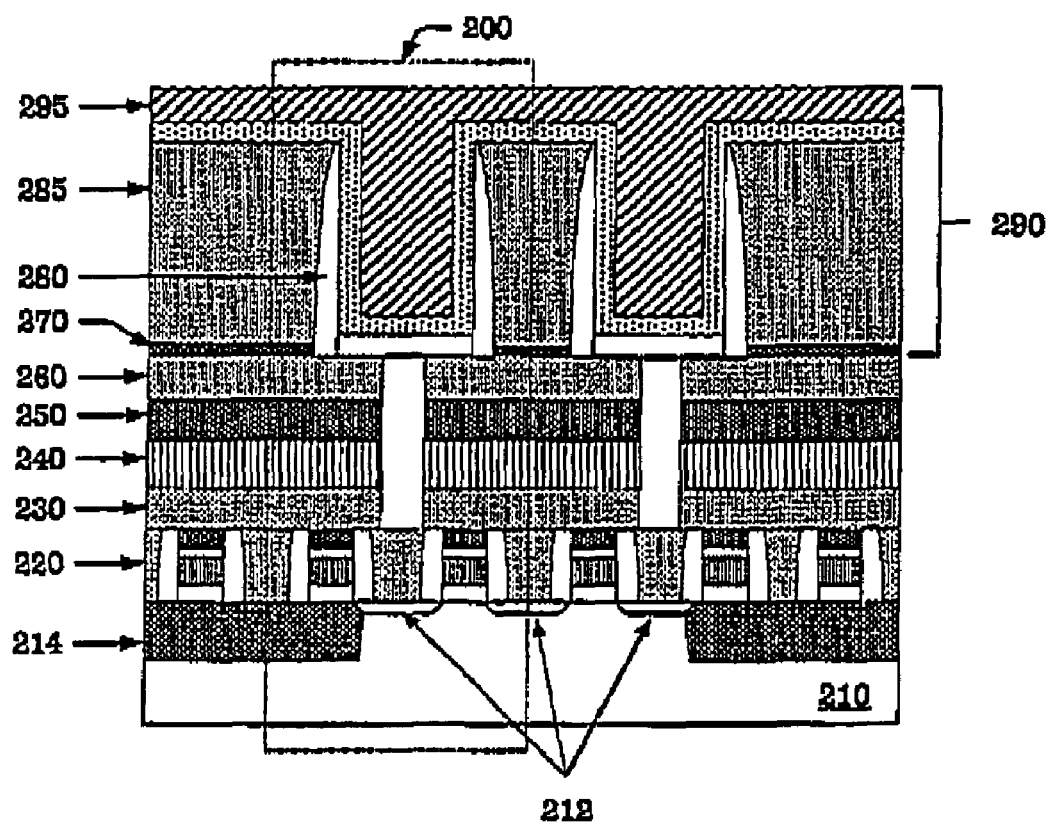
FIG. 3 is a cross-sectional view of a DRAM cell formed in accordance with a known semiconductor process.

After that a predetermined portion of the insulating interlayer 200 is selectively removed by photolithography, thereby forming the contact hole 201. Then, a conductive layer, for example, a first polysilicon layer 400 is deposited on the insulating interlayer 200, to completely fill the contact hole 201. Alternatively, dielectric layer 201 and etch stop layer 300 may be blanket deposited, patterned with a first mask (not shown) and etched to form an opening that exposes an underlying conductive structure (e.g., contacts 220 of FIG. 3). A second mask (also not shown) may then be used to form a larger opening (e.g., for the bottom plate of the cylinder) within etch stop layer 300, similar to a "dual damascene" method for forming copper metallization. By forming a larger opening in etch stop layer 300 than in dielectric layer 201, sidewall surfaces of the etch stop layer will be laterally spaced from sidewall surfaces of the dielectric layer, providing room for the base of a subsequently formed lower electrode.

In the present invention, dielectric layer 201 may comprise an interlevel dielectric layer (ILD), which may, e.g., shield an underlying bit line from a subsequently formed capacitor. However, dielectric layer 201 may have a different purpose in alternative embodiments of the invention. As such, dielectric layer 201 may include one or more layers of substantially dielectric material known in the art, such as silicon dioxide ($SiO_2$), tetraethylorhosilicate (TEOS)-based silicon dioxide, silicon nitride ($Si_xN_y$), silicon dioxide/silicon nitride/silicon dioxide (ONO), silicon carbide, silicon-rich oxide (SRO), "black diamond" or SiOC-based insulator, or carbonated polymers. Alternatively, dielectric layer 201 may be formed from a low-permittivity ("low-k") dielectric, generally known in the art as a material with a dielectric constant of less than about 3.5. One low-k dielectric in current use which is believed to make a conformal film, is fluorine-doped silicon dioxide. In some cases, dielectric layer 201 may be undoped. Alternatively, dielectric layer 201 may be doped to form, for example, borophosphosilicate glass (BPSG), phosphosilicate glass (PSG), borosilicate glass (BSG), or fluorosilicate glass (FSG). In addition, dielectric layer 201 may be deposited by chemical vapor deposition (CVD), atmospheric-pressure CVD (APCVD), low-pressure CVD (LPCVD), plasma enhanced CVD (PECVD) or by any other means known in the art.

Following deposition dielectric layer 201 may be planarized, in some cases, to provide a substantially planar upper surface of dielectric layer 201. For example, dielectric layer 201 may be planarized using a spin on glass (SOG) process or an etch back technique, such as CVD/bias-sputter etch back or sacrificial layer etch back. However, it may be desired to utilize a global planarization technique, such as chemical mechanical polishing (CMP), in submicron semiconductor technologies employing multi-level interconnect systems (such as is found and/or used in semiconductor memory devices). Subsequent to planarization, dielectric layer 201 may be formed to a depth of approximately 3,000 Å to approximately 15,000 Å, or more preferably between approximately 6,000 Å to approximately 12,000 Å. However, larger or smaller depths of dielectric layer 201 may be appropriate depending on the design specifications of the particular device being formed.

Next, etch stop layer 300 is formed upon an upper surface of dielectric layer 201. In general etch stop layer 300 may include one or more layers, which have different etching characteristics than the conductive material used to subsequently form conductive layer 400. In some cases, etch stop layer 300 may include a single layer of silicon nitride since it adheres well to many materials and has relatively good etch selectivity, as compared to polysilicon and silicon dioxide. In one example, the silicon nitride layer may be formed by deposit a layer of silicon dioxide (e.g., by a CVD process), which is nitrided in a subsequent processing step. Silicon nitride or silicon oxynitride may also be formed by a CVD process using a silicon source, such as silane or a chlorosilane ($SiH_xCl_y$, where x and y are each an integer of from 1 to 3, such that x+y=4, such as dichlorosilane [$SiCl_2H_2$], and a nitrogen source, such as nitrogen ($N_2$), nitrous oxide ($N_2O$), or ammonia ($NH_3$). However, one or more layers of other dielectric materials, which are known in the art for having different etching characteristics than conductive layer 400, may be used in other embodiments of the invention.

Following deposition, etch stop layer 300 may be planarized, in some cases, to provide etch stop layer 300 with a substantially planar upper surface. For example, etch stop layer 300 may be planarized using one of the above-mentioned planarized techniques. In any case, etch stop layer 300 may be generally formed to a depth of from approximately 500 Å to approximately 5,000 Å. To ensure that the of the subsequently formed lower electrode is sufficiently thick, etch stop layer 300 is preferably formed to a depth of from about 1,000 Å to about 3,000 Å, more preferably from approximately 2,000 Å to approximately 3,000 Å. Larger or smaller depths for etch stop layer 300 may be appropriate depending on the materials used for such layer(s) and the design specifications of the cylinder-type storage device.

After the dielectric and etch stop layers are formed and patterned, as shown in FIG. 15A and described herein, a layer of conductive material 400 may be formed upon the dielectric and etch stop layers and within the openings formed therein. As noted above, a base portion of the lower electrode may be formed by filling the opening created within etch stop layer 300. By filling the opening within dielectric layer 201 with conductive material 400, a conductive plug may also be formed for contacting an underlying conductive layer (such as, e.g., gate electrodes 220 of FIG. 2). Appropriate materials for conductive layer 400 may include, but are not limited to, doped or undoped polysilicon and substantially any metal or conductive alloy comprising one or more metals, such as aluminum, cobalt, cobalt silicide, copper, iron, nickel, nickel-iron-chromium, platinum, tantalum, tantalum nitride, titanium, titanium nitride, titanium silicide, tungsten, tungsten silicide, molybdenum silicide, or an alloy of such metals. Conductive layer 400 may be formed using conventional sputtering or any of the known deposition techniques described above. Preferably, conductive layer 400 comprises a metal or other conductive material deposited by CVD, such as polysilicon or tungsten.

In any case, conductive layer 400 is formed to a depth which is generally dependent on a height of the subsequently formed lower electrode. For example, the depth of conductive layer 400 may range between about 2,000 Å and about 10,000 Å, or more specifically, between about 3,000 Å and about 8,000 Å. After planarization and/or etching of conductive layer 400, the subsequently formed lower electrode may exhibit a height, HLE, of about 2,000 Å to about 10,000 Å, or more specifically, between about 3,000 Å and about 8,000 Å. Larger or smaller heights for the lower electrode may be appropriate depending on a desired capacitance of the cylinder-type storage device.

Figure 15B:
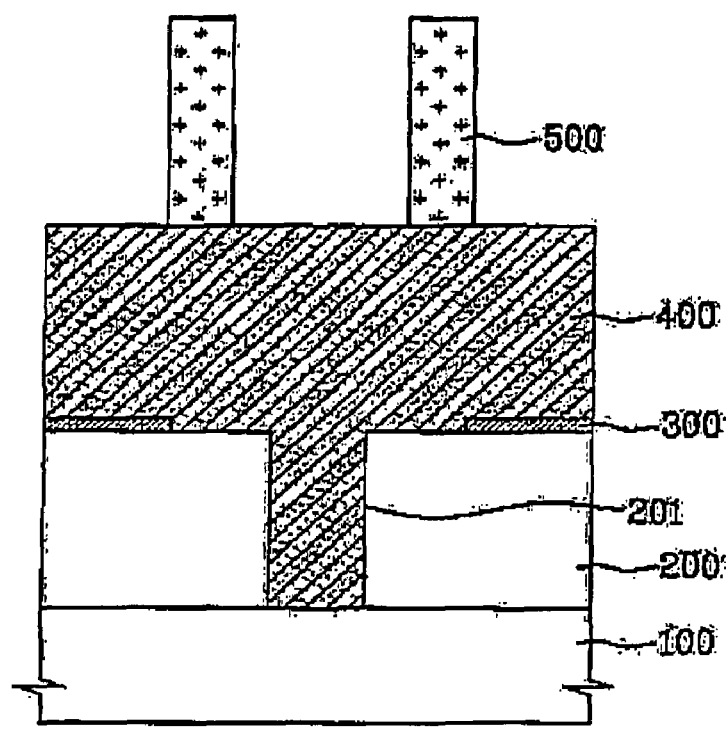

As shown in FIG. 15B, a photoresist layer 500 is deposited on the first polysilicon layer 400, and then the mask of FIG. 6 is positioned above the photoresist layer 500. Then, the over-exposure and development process is performed thereon, thereby forming the cylindrical, circular or donut-shaped photoresist layer pattern 500.

In tis case, as described above, overexposure a photoresist using the mask of FIG. 6 may generate the side lobe by the pattern shape of the transmission part 130. As a result, the circular, cylindrical or donut-shaped photoresist layer pattern 500 is formed on the portion corresponding to the boundary between the transmission part 130 and the semi-transmission part 120.

In general, the photoresist may include a deep ultraviolet resist, an I-line resist, a G-line resist, or another resist, such as an e-beam resist or an x-ray resist As such, the photoresist may be patterned using photolithography as described herein to produce a pattern 500 as shown in FIG. 15B and described in more detail herein. In some embodiments, the photoresist may include a layer of antireflective coat (ARC) material on a bottom surface thereof. An ARC layer typically includes a polymer film, which is highly absorbing and non-bleaching at the wavelength of light used to expose the photoresist during photolithography. In some cases, the photoresist and ARC layers may be spin-on deposited, or formed by means of chemical vapor deposition (CVD) or sputtering technique. In most cases, the photoresist may be formed to a depth between about 3,000 Å and about 10,000 Å. However, larger or smaller depths may be used to form the photoresist to be patterned, depending on the thickness of the underlying conductive layer and other parameters of the fabrication process.

To produce the photoresist pattern 500 shown in FIG. 15B, select regions of the photoresist are exposed to radiation (e.g., ultraviolet light) to alter the solubility of those regions. After the exposure step, the photoresist may be washed with a solvent that preferentially removes the areas of the resist with a higher solubility. If an ARC layer is included, the presence of the anti-reflective coating beneath the photoresist advantageously prevents radiation waves propagating through the photoresist from being reflected back up through the resist by underlying material. It is well known that standing waves in photoresist are caused by the conductive and destructive interference of reflected and incidence radiation waves. Such standing waves contribute to resolution loss and defects in the photoresist. Therefore, the inclusion of an ARC layer may help to prevent resist profile deformation, at least to some degree.

As described herein, the photoresist layer is patterned with a photolithography process that utilizes a (somewhat) unique mask design to produce the pattern 500 in the photoresist layer. As shown in FIG. 15B, the photoresist layer 500 may include at least one substantially cylindrically-shaped structure. It is noted, however, that although only one cylindrically-shaped structure is shown, any number of structures may be formed within the photoresist layer in accordance with the design specifications of the resulting device. Generally, however, pattern 500 comprises a regular, or repeating, pattern of cylinders in a row and column type array.

Figure 15C:
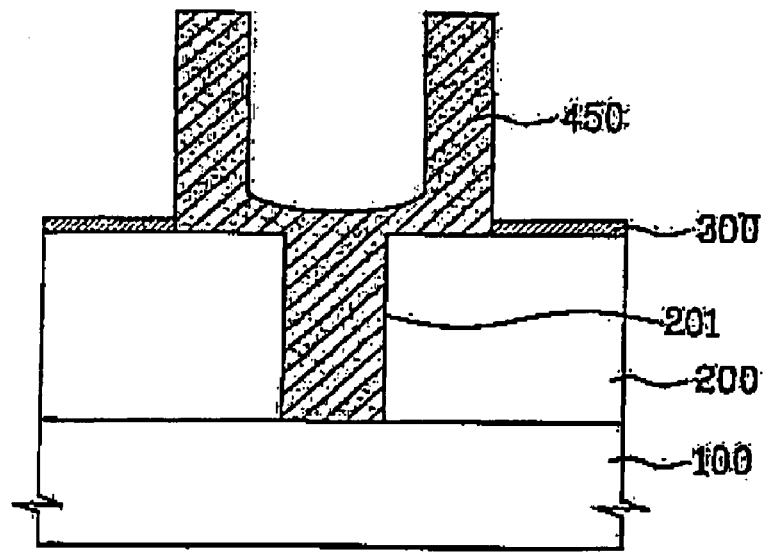

Referring to FIG. 15C, the exposed portions of the first polysilicon layer 400 are selectively etched in an anisotropic dry etching process, for example, RIE (Reactive Ion Etch), using the photoresist pattern 500 as an etch mask, thereby forming a cylindrical lower electrode 450. At this time, anisotropically dry etch in the first polysilicon layer 400 may be performed using a nitride layer as the etch stop layer 300.

In some cases, conductive layer 400 way be etched with an etch chemistry which is substantially more selective to conductive layer 400 (e.g., polysilicon) than to etch stop layer 300 (e.g., silicon nitride). In one example, conducive layer 400 may be etched substantially twice as first as etch stop layer 300 by selecting an etch chemistry, which is approximately twice as selective to the material composition of conductive layer 400. In other examples, etch chemistries for selectively etching conductive layer 400 at least five, ten, or fifty or more times faster than etch stop layer 300 may be used. Using an etch chemistry that selectively etches conductive layer 400 enables the etching process to be terminated once an upper layer of etch stop layer 300 is exposed, or before any significant etching of layer 300 occurs. After the conductive layer is etched to form lower electrode 450, remaining portions of the photoresist and/or anti-reflective coating layers may be removed from the top surface of the lower electrode, if necessary. For example, an etch technique which is more selective to the material composition of the photoresist and the anti-reflective coating layers than to nitride, oxide, or silicon may be used to remove the remaining portions.

In addition, or alternatively to selective etch chemistries, the etching process used to form lower electrode 450 may be terminated via optical endpoint detection. For example, an endpoint of the etch process may be detected when an upper surface of etch stop layer 300 is exposed. Examples of techniques generally used for optical endpoint detection include, laser interfrometry, laser reflectivity and optical emission spectroscopy. In one example, an optical emission spectroscopy endpoint detection system may be used to monitor certain components of the plasma generated during the etch process. Some of the optical emission spectroscopy components, such as the wavelength of light emitted by one or more etch by-products, are specific to the material being etched. Thus, by monitoring a wavelength of light, which is specific to the material being etched, the system can detect when one layer of the material has been removed to expose an underlying layer of the material.

By using the cylindrically-shaped pattern 500 to etch conductive layer 400, lower electrode 450 may be formed with sidewalls that are substantially cylindrical in shape (viewed from the top down) and substantially constant in thickness along a vertical length of the lower electrode (although, in some cases, the cylinder sidewalls 450 may exhibit slight thickening at locations 90° apart from each other along the radius or perimeter of the sidewall; set FIG. 13, for example).

Figure 15D:
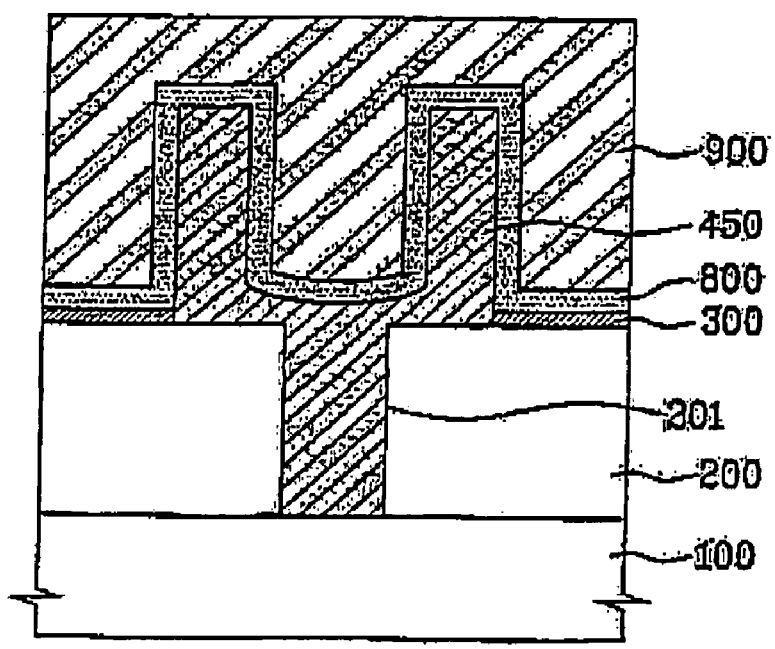

As shown in FIG. 15D, a dielectric layer 800 is deposited on an entire surface of the semiconductor substrate including the capacitor lower electrode 450, and then a second conductive material (e.g., comprising polysilicon) is deposited on the dielectric layer 800, thereby forming a capacitor upper electrode 900. In some cases, however, upper electrode 900 may be formed by deposition of one or more metal or metal-alloy layers (e.g., from among those metals and alloys described elsewhere herein). The material composition of the layer(s) used to form upper electrode 900 may be similar to, or substantially different from, the material composition of lower electrode 450. In one embodiment, upper electrode 900 may comprise CVD W (with appropriate underlying barrier and/or liner layers).

The upper electrode material 900 deposited into the cylinder including Si) generally is protected by a mask (e.g., of conventional photoresist; not shown) while the material outside the cylinder is removed (generally by etching) to form the completed upper electrode. Given the thickness of the cylinder sidewall 450, the present method provides some margin for alignment error during the upper electrode formation process. One may also reduce the height of the upper electrode material 900 by etching (typically a conventional etch back process using dry etching) or chemical mechanical polishing (CMP), generally until the upper of dielectric layer 800 (over sidewalls 450) is exposed. Thereafter, electrical connections to the electrodes can be formed conventionally.

Dielectric layer 800 may include substantially any dielectric material known in the art such as boron phosphorus silicate glass (BPSG), undoped silicate glass (USG), spin-on-glass (SOG), tetraethylorhosilicate (TEOS), or an oxide layer comprising one or more of the following alloys: silicon (Si), nitrogen (N), aluminum (Al) tantalum (Ta), barium (Ba), strontium (Sr), titanium (Ti) and lead (Pb). To improve the capacitance of the storage device, however, dielectric layer 800 may include a dielectric material with a relatively high dielectric constant (k) such as (but not limited to) aluminum oxide ($Al_2O_3$), tantalum pentoxide ($Ta_2O_5$), barium titanate ($BaTiO_3$), and titanium oxide ($TiO_2$).

Thus, the invention also concerns a cylinder-type storage device, comprising a plug in a dielectric layer on a semiconductor substrate, and a lower electrode on the dielectric layer and in contact with the plug; the sidewalls of the lower electrode being substantially cylindrical in shape and having a flat upper surface. The plug and the lower electrode are generally unitary. In other words, the present plug and lower electrode generally comprise the same conductive material and have no discernible grain boundaries between then. In one embodiment, unitary plugs and lower electrodes may be formed from material deposited in a single stop (e.g., conductive material 400 in FIG. 15A). Alternatively, the plug may be formed in a first step and material for the lower electrode deposited in a second step, then the plug and lower electrode material may be annealed so that the material of the plug and lower electrode recrystallizes, or its crystallographic morphology changes sufficiently to reduce or eliminate any discernible grain boundaries that may have existed along specific plug-lower electrode material interface prior to annealing.

As described above, the method for fabricating the capacitor according to the present invention has the following advantages.

First, side lobes may be generated by overexposure, according to the pattern shape of the transmission part of a PSM (Phase Shift Mask) for patterning contact holes, thereby forming a circular, cylindrical or donut-shaped pattern. Then, the lower electrode of the cylindrical capacitor is formed having a cylindrical or donut-shaped pattern. Accordingly, it is possible to realize a simplified fabrication process and decrease the fabrication cost. In addition, the entire fabrication time is decreased, thereby improving productivity.

Also, the method for fabricating the capacitor according to the present invention can avoid wet etching, so that it is possible to prevent the wafer from being damaged, thereby improving yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a cylinder-type storage device, the method comprising:

forming a first conductive layer above a semiconductor substrate;

forming a photoresist layer upon the first conductive layer;

overexposing the photoresist layer to radiation passed through a phase shift mask, having partially transmissive areas and transparent areas, to create a virtual image on the semiconductor substrate from a peak and to produce a pattern in the photoresist layer having at least one substantially cylindrically-shaped structure corresponding to a boundary between the partially transmissive areas and the transparent areas; and etching portions of the conductive layer not covered by the cylindrically-shaped structure to form a lower electrode of the cylinder-type storage device.

2. The method as recited in claim 1, wherein the step of etching portions of the first conductive layer produces a lower electrode with sidewalls, which are substantially cylindrical in shape and substantially constant in thickness along a vertical length of the lower electrode.

3. The method as recited in claim 1, wherein after the step of etching, the method further comprises:

removing remaining portions of the photoresist layer;

forming a second dielectric layer upon the lower electrode formed from the first conductive layer; and forming a second conductive layer upon the second dielectric layer to form an upper electrode of the cylinder-type storage device.

4. The method as recited in claim 3, wherein the second dielectric layer is selected from the group consisting of boron phosphorus silicate glass (BPSG), undoped silicate glass (USG), spin-on-glass (SOG), tetracthylorthosilicate glass (TEOS), aluminum oxide ($Al_2O_3$), tantalum pentoxide ($Ta_2O_5$), barium titanate ($BaTiO_3$), titanium oxide ($TiO_2$), and an oxide of one or more of the following: silicon (Si), nitrogen (N), aluminum (Al), tantalum (Ta), barium (Ba), strontium (Sr), titanium (Ti), and lead (Pb).

5. The method as recited in claim 3, wherein the second conductive layer is selected from the group consisting of doped or undoped polysilicon, aluminum, cobalt, cobalt silicide, copper, iron, nickel, nickel-iron-chromium, platinum, tantalum, tantalum nitride, titanium, titanium nitride, titanium silicide, tungsten, tungsten silicide, and molybdenum silicide.

6. The method as recited in claim 1, wherein prior to forming the first conductive layer, the method comprises:

forming a first dielectric layer above the semiconductor substrate; and forming an etch stop layer upon portions of the first dielectric layer, such that the first conductive layer is subsequently formed upon the etch stop layer and the first dielectric layer.

7. The method as recited in claim 6, wherein the steps of forming the first dielectric layer and the etch stop layer further comprise:

etching the first dielectric layer to form a first opening within the first dielectric layer for exposing an underlying conductive structure; and etching the etch stop layer to form a second opening within the etch stop layer, wherein opposing sidewalls of the second opening are laterally spaced from opposing sidewall surfaces of the first opening.

8. The method as recited in claim 7, wherein the step of forming the first conductive layer comprises depositing a conductive material within the first and second openings to form a conductive plug for contacting the underlying conductive structure.

9. The method as recited in claim 8, wherein the conductive material comprises polysilicon.

10. The method as recited in claim 6, wherein the first dielectric layer is selected from the group consisting of silicon dioxide ($SiO_2$), tetracthylorthosilicate (TEOS)-based silicon dioxide, silicon nitride ($Si_xN_y$), silicon dioxide/silicon nitride/silicon dioxide (ONO), silicon carbide, silicon-rich oxide (SRO), a SiOC-based insulator, carbonated polymers, fluorine-doped silicon dioxide, borophosphosilicate glass (BPSG), phosphosilicate glass (PSG), borosilicate glass (BSG), and fluorosilicate glass (FSG).

11. The method as recited in claim 6, wherein the etch stop layer comprises silicon nitride.

12. The method as recited in claim 1, wherein the phase shift mask includes a hole-shaped or donut-shaped pattern therein.

13. The method as recited in claim 1, wherein the partially transmissive areas of the phase shift mask have a transmittance of 6% to 15%.

14. The method as recited in claim 1, wherein the transparent areas of the phase shift mask have a transmittance of 100%.

15. The method as recited in claim 1, wherein overexposing is performed at and energy level from about one and a half times to about two and a half times that of a normal exposure.

16. The method as recited in claim 1, wherein overexposing enables removal of at least a portion of the photoresist layer corresponding to the partially transmissive areas.

17. The method as recited in claim 1, wherein the phase shift mask comprises a plurality of high transmittance portions in a matrix of rows and columns.

18. The method as recited in claim 1, wherein the semiconductor substrate comprises a wafer.

19. The method as recited in claim 1, further comprising removing a portion of the photoresist layer corresponding to the partially transmissive areas.

20. The method as recited in claim 19, wherein removing the portion of the photoresist comprises developing said exposed photoresist.

21. The method as recited in claim 1, wherein the first conductive layer is selected from the group consisting of doped or undoped polysilicon, aluminum, cobalt, cobalt silicide, copper, iron, nickel, nickel-iron-chromium, platinum, tantalum, tantalum nitride, titanium, titanium nitride, titanium silicide, tungsten, tungsten silicide, and molybdenum silicide.

* * * * *